United States Patent
Seon

(10) Patent No.: US 9,678,130 B2
(45) Date of Patent: Jun. 13, 2017

(54) EARTH LEAKAGE CIRCUIT BREAKER

(71) Applicant: LSIS CO., LTD., Anyang-si, Gyeonggi-do (KR)

(72) Inventor: Jong Kug Seon, Seoul (KR)

(73) Assignee: LSIS CO., LTD., Anyang-si (KR)

( * ) Notice: Subject to any disclaimer, the term of this patent is extended or adjusted under 35 U.S.C. 154(b) by 177 days.

(21) Appl. No.: 14/570,897

(22) Filed: Dec. 15, 2014

(65) Prior Publication Data
US 2015/0192631 A1    Jul. 9, 2015

(30) Foreign Application Priority Data

Jan. 7, 2014    (KR) .......................... 10-2014-0001964

(51) Int. Cl.
*G01R 31/02*    (2006.01)
*H02H 3/33*    (2006.01)

(52) U.S. Cl.
CPC ........... *G01R 31/025* (2013.01); *G01R 31/02* (2013.01); *H02H 3/33* (2013.01)

(58) Field of Classification Search
CPC ............................. G01R 31/025; G01R 31/02
USPC .................................. 324/509–510, 415–425
See application file for complete search history.

(56) References Cited

U.S. PATENT DOCUMENTS

| | | | | |
|---|---|---|---|---|
| 6,593,751 B2* | 7/2003 | Takahashi | ............ | G01R 31/346 324/509 |
| 7,068,047 B2* | 6/2006 | Ward | ....................... | H02H 3/44 324/606 |
| 2004/0070474 A1* | 4/2004 | Wu | ........................ | H02H 3/338 335/18 |
| 2012/0262183 A1* | 10/2012 | Kawamura | .......... | G01R 31/025 324/509 |
| 2013/0063842 A1* | 3/2013 | Kataoka | ................. | H02H 3/347 361/42 |
| 2013/0258537 A1* | 10/2013 | Wylie | ................ | G01R 19/2506 361/87 |

FOREIGN PATENT DOCUMENTS

| | | |
|---|---|---|
| CN | 100459351 | 2/2009 |
| JP | S61154422 | 7/1986 |
| JP | S61161921 | 7/1986 |

(Continued)

OTHER PUBLICATIONS

Japan Patent Office Application Serial No. 2015-000647, Office Action dated Jun. 14, 2016, 2 pages.

(Continued)

*Primary Examiner* — Jeff Natalini
(74) *Attorney, Agent, or Firm* — Lee Hong Degerman Kang & Waimey

(57) ABSTRACT

Disclosed is an earth leakage circuit breaker. The earth leakage circuit breaker is capable of determining an earth leakage signal applied thereto with high accuracy, by performing a trip operation by determining noise components included in the earth leakage signal, such as switching noise or harmonics, based on a determination signal generated by tracking the earth leakage signal. The earth leakage circuit breaker is capable of precisely determining whether to perform a trip operation with respect to an earth leakage signal applied thereto. The earth leakage circuit breaker is capable of preventing a malfunction due to a noise signal similar to an earth leakage signal.

15 Claims, 5 Drawing Sheets

(56) References Cited

FOREIGN PATENT DOCUMENTS

| | | |
|---|---|---|
| JP | 05-015045 | 1/1993 |
| JP | 2000-102158 | 4/2000 |
| JP | 2002098728 | 4/2002 |
| JP | 2004-220859 | 8/2004 |
| JP | 2004354173 | 12/2004 |
| JP | 2010244793 | 10/2010 |
| KR | 10-2001-0088890 | 9/2001 |
| KR | 10-2011-0032871 | 3/2011 |
| WO | 2004/001924 | 12/2003 |

OTHER PUBLICATIONS

Japan Patent Office Application Serial No. 2015-000647, Office Action dated Nov. 10, 2015, 5 pages.
European Patent Office Application Serial No. 14198299.1, Search Report dated May 20, 2015, 8 pages.
Korean Intellectual Property Office Application Serial No. 10-2014-0001964, Office Action dated Jun. 16, 2015, 5 pages.
Japan Patent Office Application Serial No. 2015-000647, Office Action dated Jun. 14, 2016, 5 pages.
State Intellectual Property Office of the People's Republic of China Application Serial No. 201510007992.5, Office Action dated Feb. 17, 2017, 6 pages.

* cited by examiner

EARTH LEAKAGE CIRCUIT BREAKER

CROSS-REFERENCE TO RELATED APPLICATION

Pursuant to 35 U.S.C. §119(a), this application claims the benefit of earlier filing date and right of priority to Korean Application No. 10-2014-0001964, filed on Jan. 7, 2014, the contents of which is incorporated by reference herein in its entirety.

BACKGROUND OF THE DISCLOSURE

1. Field of the Disclosure

This specification relates to an earth leakage circuit breaker, and more particularly, to an earth leakage circuit breaker which can be operated by determining whether harmonic waves (harmonics) have been included in an earth leakage signal or not, based on a determination signal generated by tracking the earth leakage signal applied thereto.

2. Background of the Disclosure

FIG. 1 is a block diagram illustrating a circuit configuration for a trip operation of an earth leakage circuit breaker in accordance with the conventional art.

As shown in FIG. 1, in the conventional earth leakage circuit breaker, once an earth leakage signal is sensed by a zero-phase current transformer (abbreviated as ZCT hereinafter), the earth leakage signal is amplified by an amplifier. The amplified earth leakage signal is compared with a reference voltage set by a level discriminator. If the amplified earth leakage signal is greater than the reference voltage, a trip signal generator transmits a trip control signal to a trip mechanism. The trip mechanism triggers a switching mechanism to a trip position (i.e., an automatic circuit breaking position), and the switching mechanism breaks (disconnects) an electric circuit. Under such configuration, an electric load and a human body can be protected when current leakage occurs.

In the conventional earth leakage circuit breaker, a malfunction does not occur on a circuit to which a linear load not having noise or distortion is connected. However, most of electronic and electric devices adopting alternating current (abbreviated as AC hereinafter) electric power do not directly use AC, but convert the AC into a direct current (abbreviated as DC hereinafter). During such conversion, a switching device is used to enhance efficiency. Due to such switching operation, a pure AC signal has noise, and the AC signal is distorted. That is, even if an earth leakage signal does not occur, harmonics due to switching noise and signal distortion are detected by a ZCT, in a similar manner to the earth leakage signal, because unbalancing among phases occurs on the AC signal. In the conventional art where only levels of signals are compared with each other, a trip operation may be erroneously performed due to noise or harmonics greater than a reference voltage.

SUMMARY OF THE DISCLOSURE

Therefore, an object of the invention is to provide an earth leakage circuit breaker capable of preventing a malfunction due to noise, by performing a trip operation by determining noise components included in an earth leakage signal, such as switching noise or harmonics, based on a determination signal generated by tracking the earth leakage signal.

To achieve these and other advantages and in accordance with the purpose of this disclosure, as embodied and broadly described herein, there is provided an earth leakage circuit breaker, comprising:

a trip coil configured to generate an electromagnetic force for tripping a circuit;

a detection unit configured to detect an earth leakage signal on the circuit;

a signal generation unit configured to generate a determination signal by tracking the earth leakage signal; and a controller configured to determine whether the earth leakage signal includes noise or not by comparing the determination signal with a reference signal, and configured to control an operation of the trip coil according to a result of the determination.

According to an aspect of this disclosure, the detection unit comprises:

a zero-phase current transformer configured to detect the earth leakage signal and an amplifier configured to amplify the detected earth leakage signal.

According to another aspect of this disclosure, the determination signal is generated by tracking the earth leakage signal according to time.

According to still another aspect of this disclosure, the determination signal is generated as a pulse width modulation signal (abbreviated as PWM signal hereinafter).

According to still another aspect of this disclosure, the determination signal is configured by a combination of a low pulse and a high pulse.

According to still another aspect of this disclosure, the signal generation unit comprises a charging and discharging circuit, and the determination signal is generated as an output signal of the charging and discharging circuit tracks the earth leakage signal.

According to still another aspect of this disclosure, the signal generation unit comprises: a first voltage discriminator configured to charge the charging and discharging circuit, by comparing the earth leakage signal and the output signal with a first reference voltage; a second voltage discriminator configured to compare the output signal with the earth leakage signal and a second reference voltage, and to generate a signal according to a result of the comparison; a pulse generator configured to generate a determination signal by generating one of a high pulse and a low pulse, based on the signal according to a result of the comparison of the second voltage discriminator; and a switch connected to the charging and discharging circuit, and configured to discharge the charging and discharging circuit by being opened when the high pulse is applied thereto from the pulse generator, the switch configured to charge the charging and discharging circuit by being closed when the low pulse generated is applied thereto from the pulse generator, wherein the output signal is fed-back to the second voltage discriminator until tracking the earth leakage signal is completed.

According to still another aspect of this disclosure, the first reference voltage is a minimum reference voltage, a reference voltage value for tripping the earth leakage circuit breaker, and the second reference voltage is a minimum reference voltage, a minimum output level of the charging and discharging circuit.

According to still another aspect of this disclosure, the earth leakage signal is greater than the first reference voltage, the first voltage discriminator is configured to charge the charging and discharging circuit such that a size of the output signal becomes equal to a size of the earth leakage signal.

According to still another aspect of this disclosure, when a size of the output signal becomes equal to a size of the earth leakage signal, the second voltage discriminator generates a rising signal for decreasing the output signal, and when a size of the output signal becomes equal to a size of the second reference voltage, the second voltage discriminator generates a falling signal for increasing the output signal.

According to still another aspect of this disclosure, the pulse generator is configured to generate the high pulse when the rising signal is generated, and to generate the low pulse when the falling signal is generated.

According to still another aspect of this disclosure, the reference signal is generated by tracking a pure earth leakage signal not including noise.

According to still another aspect of this disclosure, the control unit compares a period and a pulse width of the determination signal, with a period and a pulse width of the reference signal.

According to still another aspect of this disclosure, when the determination signal is consistent with the reference signal, the control unit controls the trip coil to be magnetized.

According to still another aspect of this disclosure, when the determination signal is not consistent with the reference signal, the control unit controls the trip coil to be demagnetized, by determining that the earth leakage signal includes noise.

According to still another aspect of this disclosure, the control unit determines a size of the earth leakage signal based on a period and a pulse width of the determination signal, and controls an operation time of the trip coil according to the determined size of the earth leakage signal.

According to still another aspect of this disclosure, when the determined size of the earth leakage signal is larger than a size of the reference signal, the control unit shortens an operation time of the trip coil.

Further scope of applicability of the present application will become more apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the detailed description.

BRIEF DESCRIPTION OF THE DRAWINGS

The accompanying drawings, which are included to provide a further understanding of the disclosure and are incorporated in and constitute a part of this specification, illustrate exemplary embodiments and together with the description serve to explain the principles of the disclosure.

In the drawings.

DETAILED DESCRIPTION OF THE DISCLOSURE

The present invention may be applicable to an earth leakage circuit breaker. However, the present invention may be also applicable to all types of relays, circuit breakers, controllers, switching devices, power protective equipment, and relay systems.

The technical terms used in the present specification are set forth to mention specific embodiments of the present invention, and do not intend to define the scope of the present invention. As far as not being defined differently, all terms used herein including technical or scientific terms may have the same meaning as those generally understood by an ordinary person skilled in the art to which the present disclosure belongs to, and should not be construed in an excessively comprehensive meaning or an excessively restricted meaning. In addition, if a technical term used in the description of the present disclosure is an erroneous term that fails to clearly express the idea of the present disclosure, it should be replaced by a technical term that can be properly understood by the skilled person in the art. In addition, general terms used in the description of the present disclosure should be construed according to definitions in dictionaries or according to its front or rear context, and should not be construed to have an excessively restrained meaning.

A singular representation may include a plural representation as far as it represents a definitely different meaning from the context. Terms 'include' or 'has' used herein should be understood that they are intended to indicate an existence of several components or several steps, disclosed in the specification, and it may also be understood that part of the components or steps may not be included or additional components or steps may further be included.

Preferred embodiments of the present invention will be described below in detail with reference to the accompanying drawings where those components are rendered the same reference number that are the same or are in correspondence, regardless of the figure number, and redundant explanations are omitted.

In describing the present invention, if a detailed explanation for a related known function or construction is considered to unnecessarily divert the gist of the present invention, such explanation has been omitted but would be understood by those skilled in the art. The accompanying drawings are used to help easily understood the technical idea of the present invention and it should be understood that the idea of the present invention is not limited by the accompanying drawings.

Hereinafter, a circuitry configuration of an earth leakage circuit breaker according to the present invention will be explained with reference to FIG. 2.

Figure 1:
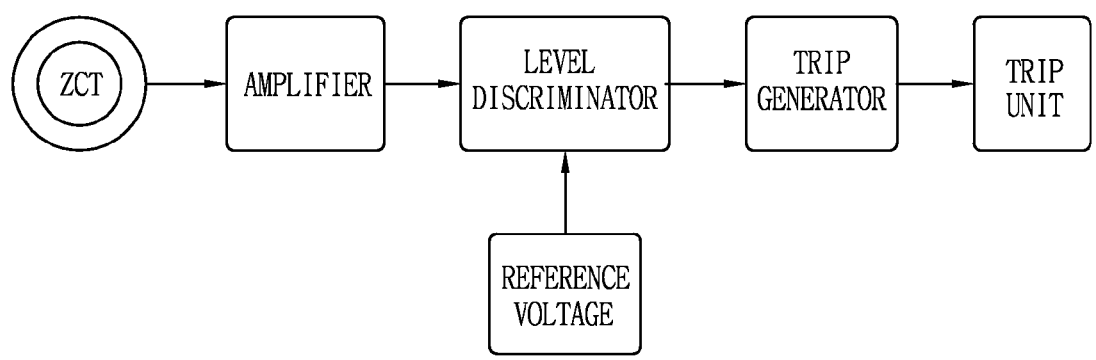
FIG. 1 is a block diagram illustrating a configuration for a trip operation of an earth leakage circuit breaker in accordance with the conventional art.
Figure 2:
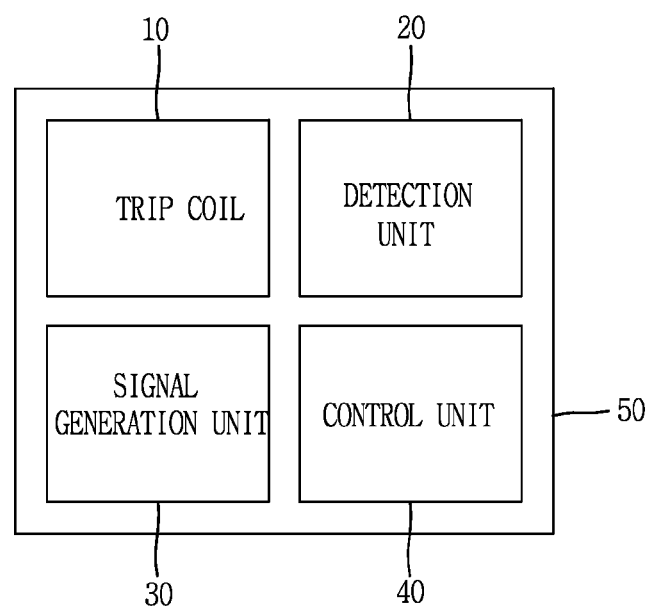
FIG. 2 is a block diagram illustrating a circuitry configuration of an earth leakage circuit breaker according to an embodiment of the present invention.

FIG. 2 is a block diagram illustrating a circuitry configuration of an earth leakage circuit breaker according to an embodiment of the present invention;

As shown in FIG. 2, an earth leakage circuit breaker according to the present invention comprises a trip coil 10, a detection unit 20, a signal generation unit 30, and a control unit 40.

The earth leakage circuit breaker 50 may be connected to an electrical circuitry (i.e., an electric power circuit or can be abbreviated as circuit hereinafter) on which a current flows.

The earth leakage circuit breaker 50 may protect the circuit and an electric load connected to the circuit, from a fault current such as an over-current or a short circuit or a leakage current.

The leakage current may mean a current leaking to the earth unintentionally, not flowing on the circuit.

In occurrence of the leakage current, the earth leakage circuit breaker 50 may break the circuit so as to protect the circuit and the load connected to the circuit.

The trip coil 10 may generate an electromagnetic force for triggering a switching mechanism (not shown) included in the earth leakage circuit breaker 50, into a trip position.

The trip coil 10 may be magnetized by a trip control signal generated from the control unit 40, thereby generating the electromagnetic force.

The trip control signal may mean a signal for controlling a magnetization operation of the trip coil 10 such that the circuit is broken.

The detection unit 20 may detect occurrence of the leakage current on the circuit.

The detection unit 20 may detect the leakage current occurred on the circuit, and may generate an earth leakage signal corresponding to the leakage current.

The detection unit 20 may transmit the generated earth leakage signal, to the signal generation unit 30.

The signal generation unit 30 may generate a determination signal by tracking the earth leakage signal.

The determination signal may serve as a signal by which it is determined whether current leakage has occurred on the circuit or not.

The determination signal may be generated by tracking a size of the earth leakage signal, and a frequency change of the earth leakage signal.

The controller 40 may determine whether the earth leakage signal includes noise or not, by comparing the determination signal with a reference signal. Then the controller 40 may control an operation of the trip coil 10 according to a result of the determination.

Hereinafter, the earth leakage circuit breaker according to the present invention will be explained in more detail with reference to FIGS. 3 and 4.

Figure 3:
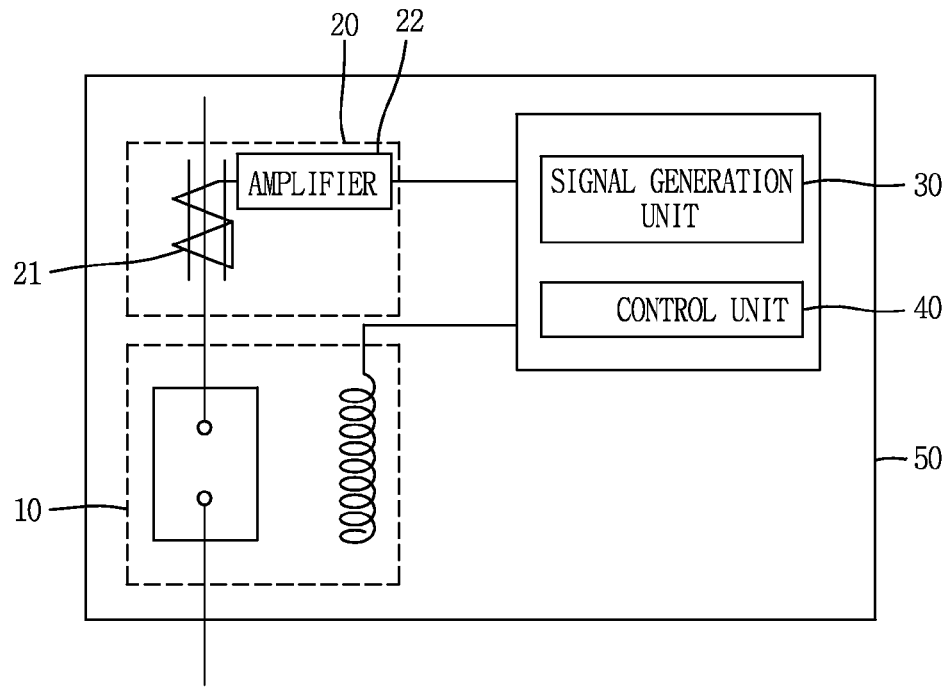
FIG. 3 is a block diagram illustrating a circuitry configuration of an earth leakage circuit breaker according to another embodiment of the present invention.
Figure 4:
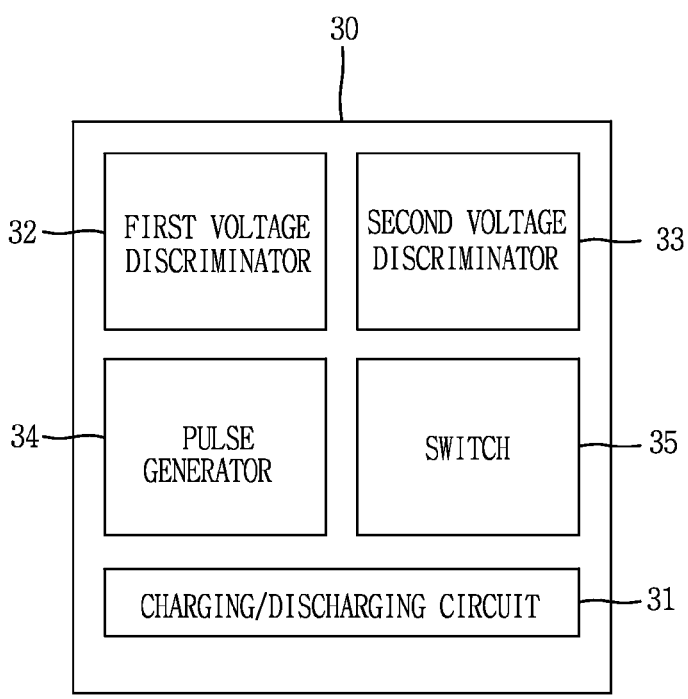
FIG. 4 is a block diagram illustrating a configuration of a signal generation unit of an earth leakage circuit breaker according to an embodiment of the present invention.

FIG. 3 is a block diagram illustrating a circuitry configuration of an earth leakage circuit breaker according to another embodiment of the present invention, and FIG. 4 is a block diagram illustrating a configuration of a signal generation unit of an earth leakage circuit breaker according to an embodiment of the present invention.

As shown in FIG. 3, the earth leakage circuit breaker 50 may include the trip coil 10, the detection unit 20, the signal generation unit 30, and the control unit 40. And the earth leakage circuit breaker 50 may be connected to a circuit on which a current flows.

The trip coil 10 may be engaged with the switching mechanism to trigger the switching mechanism such that the switching mechanism opens (in other words "trips") the circuit, when magnetized.

The trip coil 10 may disconnect the circuit by triggering the switching mechanism in response to the trip control signal when a leakage current occurs such that the switching mechanism operates to a trip position.

The detection unit 20 may be installed around the circuit so as to detect an earth leakage signal by sensing a leakage current.

The detection unit 20 may comprise a zero phase current transformer (abbreviated as ZCT hereinafter) 21 for detecting an earth leakage signal, and an amplifier 22 for amplifying the detected earth leakage signal.

The earth leakage signal may be detected through the ZCT 21.

The ZCT 21 may be configured to detect a zero-phase sequence current component leaking from a circuit, and to convert the component into a signal (e.g., a voltage signal) proper to be measured by the control unit 40.

The amplifier 22 may amplify the detected earth leakage signal into a size proper to be measured by the control unit 40.

As the detected earth leakage signal is amplified by the amplifier 22, the earth leakage signal can be easily tracked.

The earth leakage signal, which has been detected by the ZCT 21 and amplified by the amplifier 22, may be transmitted to the signal generation unit 30.

The signal generation unit 30 may generate a determination signal by tracking the earth leakage signal.

The determination signal may be generated as the earth leakage signal is tracked as time lapses.

The determination signal may be generated as a PWM signal.

The determination signal may be formed by combination of a low pulse and a high pulse.

As shown in FIG. 4, the signal generation unit 30 may comprise a charging and discharging circuit 31.

The charging and discharging circuit 31 may be charged or discharged by the signal generation unit 30.

The signal generation unit 30 comprises the charging and discharging circuit 31, and the determination signal may be generated as an output signal of the charging and discharging circuit 31 tracks the earth leakage signal.

That is, the determination signal may be generated in a principle that an output signal due to charging and discharging of the charging and discharging circuit 31 tracks the earth leakage signal.

When the charging and discharging circuit 31 is charged, the output signal may be increased.

On the contrary, when the charging and discharging circuit 31 is discharged, the output signal may be decreased.

That is, the output signal may be configured to be increased while the charging and discharging circuit 31 is charged, but to be decreased while the charging and discharging circuit 31 is discharged. Under such configuration, the output signal may track the earth leakage signal.

Since the output signal tracks the earth leakage signal with its size increased and decreased in a repeated manner, the determination signal may be generated as two types of signals which are increased and decreased in a repeated manner.

Referring to FIG. 4, the signal generation unit 30 may further comprise a first voltage discriminator 32, a second voltage discriminator 33, a pulse generator 34, and a switch 35. The output signal may be fed-back to the second voltage discriminator 33 until tracking the earth leakage signal is completed.

The first voltage discriminator 32 included in the signal generation unit 30 is a component for charging the charging and discharging circuit 31, by comparing the earth leakage signal and the output signal with a first reference voltage.

The first reference voltage may be a minimum reference voltage, a reference value for breaking (tripping) the earth leakage circuit breaker 50.

For instance, in a case where the earth leakage circuit breaker 50 is operated at an earth leakage signal of 10 volts (V), the first reference voltage may be 10 (V).

When the earth leakage signal and the output signal are greater than the first reference voltage, the first voltage discriminator 32 may charge the charging and discharging circuit 31.

That is, in a case where the earth leakage signal and the output signal are greater than a minimum reference voltage of the earth leakage circuit breaker 50, the first voltage discriminator 32 charges the charging and discharging circuit 31 so that the output signal can track the earth leakage signal with its size increased.

The signal generation unit 30 may further comprise the second voltage discriminator 33 for comparing the output signal with the earth leakage signal and a second reference voltage, and generating a signal according to a result of the comparison.

The second reference voltage may be a minimum reference voltage, a minimum output level of the charging and discharging circuit 31.

For instance, in a case where a minimum output level of the charging and discharging circuit 31 is 5 volts (V), the second reference voltage may be 5 (V).

In a case where the output signal has the same size as the earth leakage signal and the second reference voltage, the second voltage discriminator 33 may generate a signal for charging or discharging the charging and discharging circuit 31.

Figure 7:
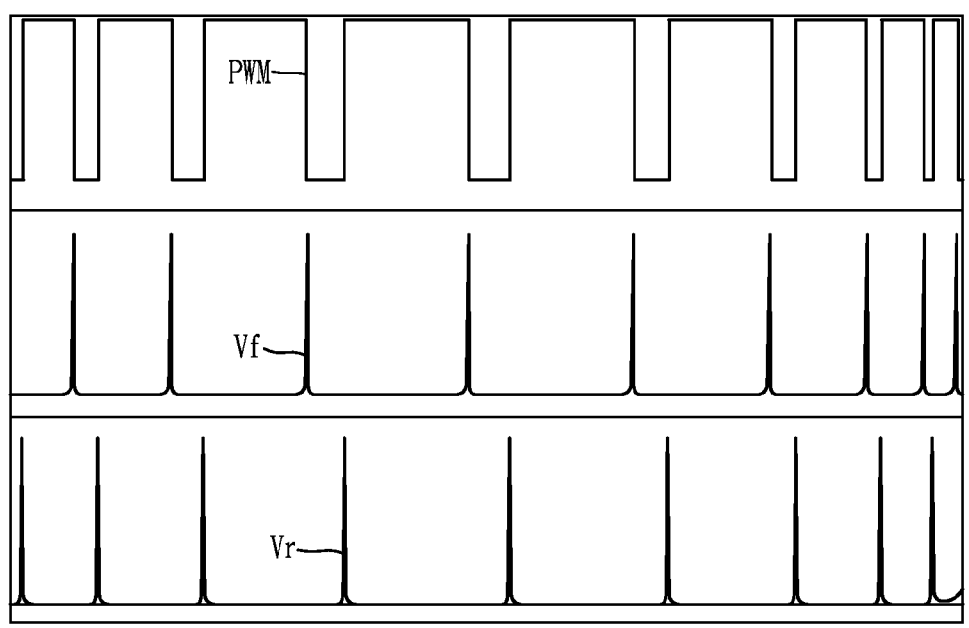
FIG. 7 is a waveform illustrating generation of a determination signal in a circuitry of an earth leakage circuit breaker according to an embodiment of the present invention.

In a case where the output signal has the same size as the earth leakage signal, the second voltage discriminator 33 may generate a rising signal for decreasing the output signal (refer to a waveform by Vr of FIG. 7).

More specifically, if the output signal has the same size as the earth leakage signal as the output signal is increased because the charging and discharging circuit 31 has been charged by the first voltage discriminator 32, the second voltage discriminator 33 may generate a rising signal (Vr) for decreasing the output signal by discharging the charging and discharging circuit 31.

In a case where the output signal has the same size as the second reference voltage, the second voltage discriminator 33 may generate a falling signal for increasing the output signal (refer to a waveform by Vf of FIG. 7).

More specifically, if the output signal has the same size as the second reference voltage as the output signal is decreased because the charging and discharging circuit 31 has been discharged by the rising signal (Vr), the second voltage discriminator 33 may generate a falling signal (Vf) for increasing the output signal by charging the charging and discharging circuit 31.

The signal generation unit 30 may further comprise the pulse generator 34 for generating a determination signal by generating any one of a high pulse and a low pulse, based on a signal according to a result of the comparison by the second voltage discriminator 33.

The pulse generator 34 may generate a high pulse or a low pulse according to a signal generated by the second voltage discriminator 33, thereby generating a determination signal through a combination of the high pulse and the low pulse.

The pulse generator 34 may generate the high pulse when the second voltage discriminator 33 generates the rising signal (Vr), and may generate the low pulse when the second voltage discriminator 33 generates the falling signal (Vf).

That is, in a case where the second voltage discriminator 33 generates the rising signal (Vr) as the output signal has the same size as the earth leakage signal, the pulse generator 34 generates the high pulse indicating that the output signal, which tracks the earth leakage signal, is increased to have the same size as the earth leakage signal. On the contrary, in a case where the second voltage discriminator 33 generates the falling signal (Vf) as the output signal has the same size as the second reference voltage, the pulse generator 34 generates the low pulse indicating that the output signal, which tracks the earth leakage signal, is decreased to have the same size as the second reference voltage. Thus, the pulse generator 34 may generate a determination signal formed by a combination of the high pulse and the low pulse.

The signal generation unit 30 may further comprise the switch 35 connected to the charging and discharging circuit 31, the switch 35 configured to discharge the charging and discharging circuit 31 by being opened when the high pulse is applied thereto from the pulse generator 34, the switch configured to charge the charging and discharging circuit 31 by being closed when the low pulse generated is applied thereto from the pulse generator 34.

That is, in occurrence of the high pulse indicating that the output signal is increased to have the same size as the earth leakage signal, the switch 35 may be opened so that the charging and discharging circuit 31 can be discharged, for decrease of the output signal. On the other hand, in occurrence of the low pulse indicating that the output signal is decreased to have the same size as the second reference voltage, the switch 35 may be closed so that the charging and discharging circuit 31 can be charged, for increase of the output signal.

Referring to FIG. 3 back, the control unit 40 may determine whether the earth leakage signal includes noise or not, by comparing the determination signal with the reference signal, and may control an operation of the trip coil 10 according to a result of the determination. The reference signal may be generated by tracking a pure earth leakage signal not including noise.

That is, as the reference signal is generated by tracking a pure earth leakage signal not including noise, in a case where the determination signal has been generated by tracking an earth leakage signal including noise, whether the earth leakage signal includes noise or not may be determined by the reference signal.

The control unit 40 may compare a period and a pulse width of the determination signal, with those of the reference signal.

The reference signal is generated by tracking a pure earth leakage signal, and a period and a pulse width of the reference signal indicate a period and a pulse width of the pure earth leakage signal. Thus, in a case where the determination signal has been generated by tracking an earth leakage signal including noise, whether the earth leakage signal includes noise or not may be determined by comparing a period and a pulse width of the reference signal with those of the determination signal.

The controller 40 may control the trip coil 10 to be magnetized when the determination signal is consistent with the reference signal.

A consistent state between the determination signal and the reference signal means that the earth leakage signal corresponds to the pure earth leakage signal. Thus, in a case where the determination signal is consistent with the reference signal, the control unit 40 may control the trip coil 10 to be magnetized with respect to the earth leakage signal, resulting in disconnection of the circuit.

In a case where the determination signal is not consistent with the reference signal, the control unit 40 may control the trip coil 10 not to be magnetized, by determining that the earth leakage signal includes noise.

A non-consistent state between the determination signal and the reference signal means that the earth leakage signal does not correspond to the pure earth leakage signal because it includes noise. Thus, in a case where the determination signal is not consistent with the reference signal, the control unit 40 may control the trip coil 10 not to be magnetized with respect to the earth leakage signal, resulting in closing of the circuit.

The control unit 40 may determine a size of the earth leakage signal based on a period and a pulse width of the determination signal, and may control an operation time taken to magnetize the trip coil 10 according to the determined size of the earth leakage signal.

Since the determination signal has been generated by tracking the earth leakage signal, the control unit 40 may determine a size of the earth leakage signal based on a period and a pulse width of the determination signal, and may control an operation time taken to magnetize the trip coil 10 according to the determined size of the earth leakage signal.

If the determined size of the earth leakage signal is larger than a size of the reference signal, the control unit 40 may shorten time taken to magnetize the trip coil 10.

A state where a size of the earth leakage signal is larger than a size of the reference signal, means that a size of the earth leakage signal is larger than a size of the pure earth leakage signal, and means that the earth leakage signal is more dangerous than the pure earth leakage signal. In this case, the earth leakage signal should be tripped faster than a trip operation time with respect to the pure earth leakage signal. Thus, the control unit 40 reduces time taken to magnetize the trip coil 10.

For instance, in a case where a trip operation time with respect to the pure earth leakage signal is 0.1 seconds [s], if it is determined that the size of the earth leakage signal is larger than the size of the reference signal, the control unit 40 may shorten an operation time of the trip coil 10 to 0.1 [s] or less than.

Hereinafter, processes to track an earth leakage signal and to generate a determination signal by the earth leakage circuit breaker of the present invention will be explained in more detail with reference to FIGS. 6 to 9 as well as FIG. 5.

Figure 5:
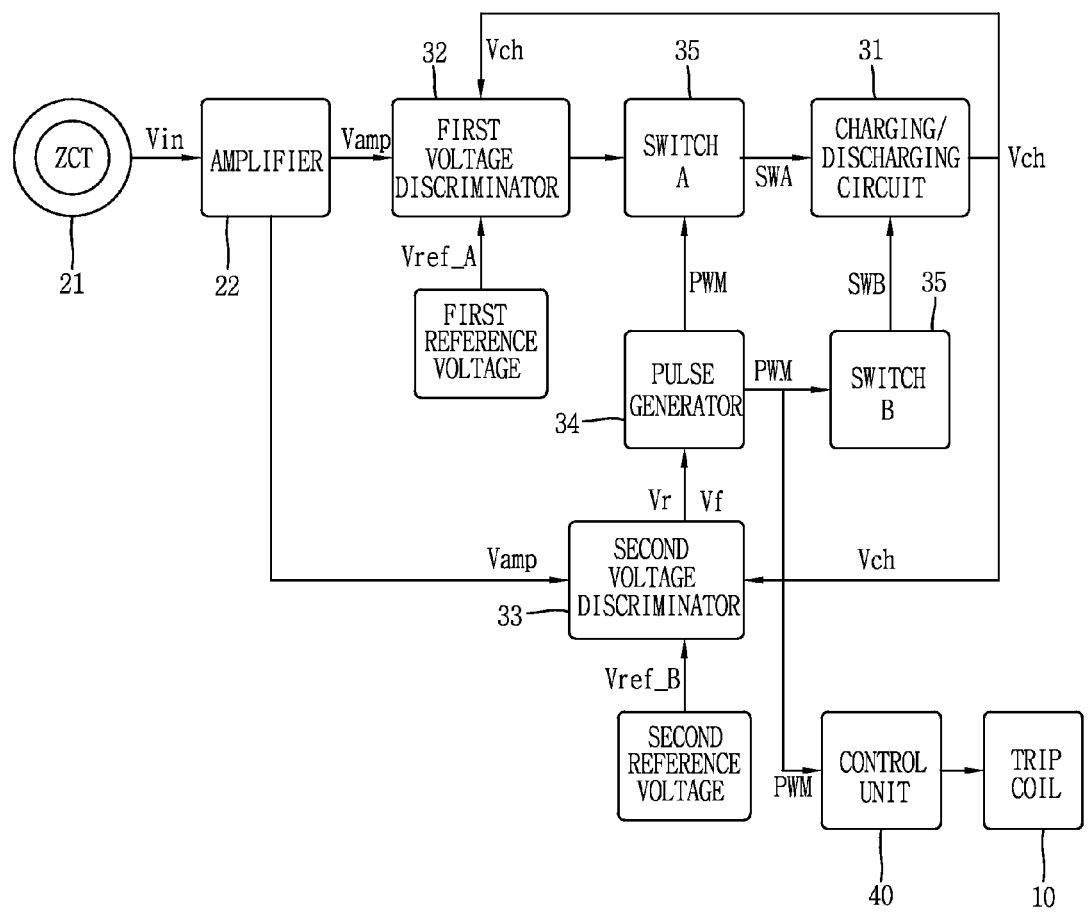
FIG. 5 is a block diagram illustrating a configuration to track an earth leakage signal and to generate a determination signal, in a circuitry of an earth leakage circuit breaker according to an embodiment of the present invention.

As shown in FIG. 5, the earth leakage circuit breaker 50 may detect an earth leakage signal (Vin) on the circuit, by the ZCT 21.

The earth leakage signal (Vin) detected by the ZCT 21 may be amplified as an earth leakage signal (Vamp) amplified by the amplifier 22, and may be transmitted to the first voltage discriminator 32.

The first voltage discriminator 32 may compare a size of the amplified earth leakage signal (Vamp) and a size of an output signal (Vch) of the charging and discharging circuit 31, with a size of the first reference voltage (Vref_A), a minimum reference voltage of the earth leakage circuit breaker 50.

If the size of the amplified earth leakage signal (Vamp) is greater than the size of the first reference value (Vref_A), the first voltage discriminator 32 may charge the charging and discharging circuit 31 so that the size of the output signal (Vch) can be equal to the size of the amplified earth leakage signal (Vamp).

If the size of the amplified earth leakage signal (Vamp) is greater than the size of the first reference voltage (Vref_A), the first voltage discriminator 32 may output a closing control signal to the switch A 35 so that the switch A 35 can be closed for charging of the charging and discharging circuit 31.

Then, the output signal (Vch) may be fed-back to the second voltage discriminator 33. In this case, the second voltage discriminator 33 may compare the size of the output signal (Vch) with the size of the amplified earth leakage signal (Vamp) and a size of the second reference voltage (Vref_B), a minimum output voltage of the charging and discharging circuit 31.

Figure 6:
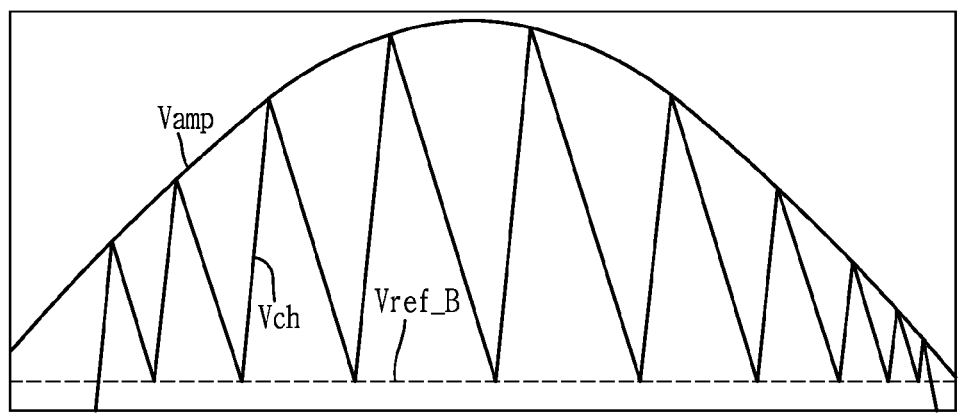
FIG. 6 is a waveform illustrating tracking an earth leakage signal in a circuitry of an earth leakage circuit breaker according to an embodiment of the present invention.

As shown in FIG. 6, the second voltage discriminator 33 may compare the size of the fed-back output signal (Vch) with the size of the amplified earth leakage signal (Vamp) and the size of the second reference voltage (Vref_B). If the size of the output signal (Vch) becomes equal to the size of the amplified earth leakage signal (Vamp), the second voltage discriminator 33 may decrease the output signal (Vch) by discharging the charging and discharging circuit 31.

If the size of the output signal (Vch) becomes equal to the size of the amplified earth leakage signal (Vamp), the second voltage discriminator 33 opens the switch 35 so that the charging and discharging circuit 31 can be discharged. For instance, the second voltage discriminator 33 may open the switch 35 by stopping the output of the closing control signal to the switch 35. As the second voltage discriminator 33 generates the rising signal (Vr) to output it to the pulse generator 34, the pulse generator 34 generates a high pulse in response to the rising signal (Vr). In this case, the pulse generator 34 outputs the high pulse as the determination signal (PWM).

Then, the output signal (Vch) may be fed-back again to the second voltage discriminator 33. In this case, the second voltage discriminator 33 may compare the size of the output signal (Vch) with the size of the amplified earth leakage signal (Vamp) and the size of the second reference voltage (Vref_B).

Referring to FIG. 6 and FIG. 5, the second voltage discriminator 33 may compare the size of the fed-back output signal (Vch) with the size of the amplified earth leakage signal (Vamp) and the size of the second reference voltage (Vref_B). If the size of the output signal (Vch) becomes equal to the size of the second reference voltage (Vref_B), the second voltage discriminator 33 may increase the output signal (Vch) by charging the charging and discharging circuit 31.

More specifically, if the size of the output signal (Vch) becomes equal to the size of the second reference voltage (Vref_B), the second voltage discriminator 33 closes the switch 35 so that the charging and discharging circuit 31 can be charged again. That is, the second voltage discriminator 33 outputs a closing control signal to the switch 35 so that the switch 35 can be closed. The second voltage discriminator 33 generates the falling signal (Vf) so that the pulse generator 34 can generate a low pulse in response to the falling signal (Vf)(see FIG. 7). In this case, the pulse generator 34 outputs the low pulse as the determination signal (PWM).

The output signal (Vch) may be fed-back again to the second voltage discriminator 33 until tracking the amplified earth leakage signal (Vamp) is completed.

The determination signal (PWM) generated as such processes are repeatedly performed may be formed as a waveform shown in FIG. 7.

As shown in FIG. 7, the determination signal (PWM) may be configured as a high pulse when the rising signal (Vr) is generated, and configured as a low pulse when the falling signal (Vf) is generated.

A PWM waveform of FIG. 7 indicates that a pure earth leakage signal has been tracked, and such waveform may be the same as that of the reference signal.

That is, the reference signal has the same waveform as the determination signal (PWM) of FIG. 7, and the determination signal (PWM) may serve as the reference signal by which it is determined whether the earth leakage signal of the earth leakage circuit breaker 50 includes noise or not.

Figure 8:
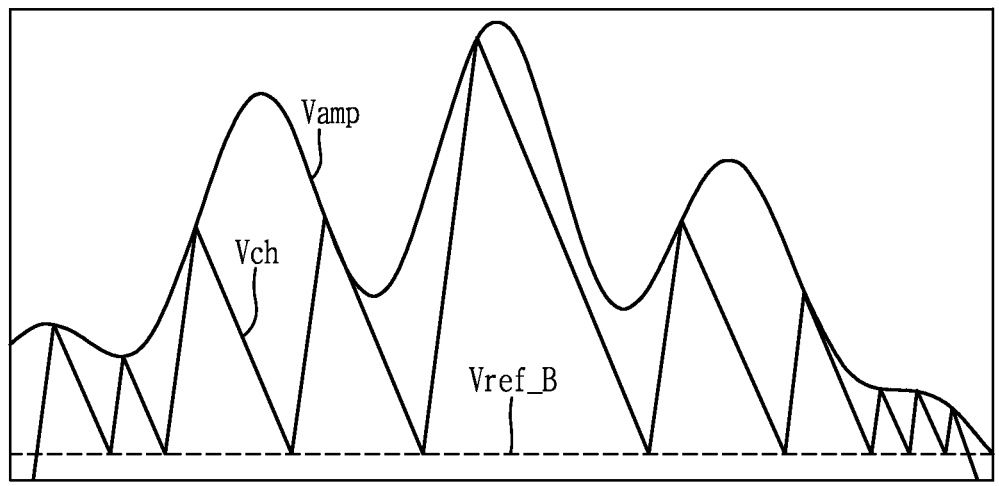
FIG. 8 is another waveform illustrating tracking an earth leakage signal in a circuitry of an earth leakage circuit breaker according to an embodiment of the present invention.

On the contrary, a PWM waveform of FIG. 8 indicates that an earth leakage signal including noise has been tracked. The PWM waveform of FIG. 8 may be the same as a PWM waveform shown in FIG. 9.

Figure 9:
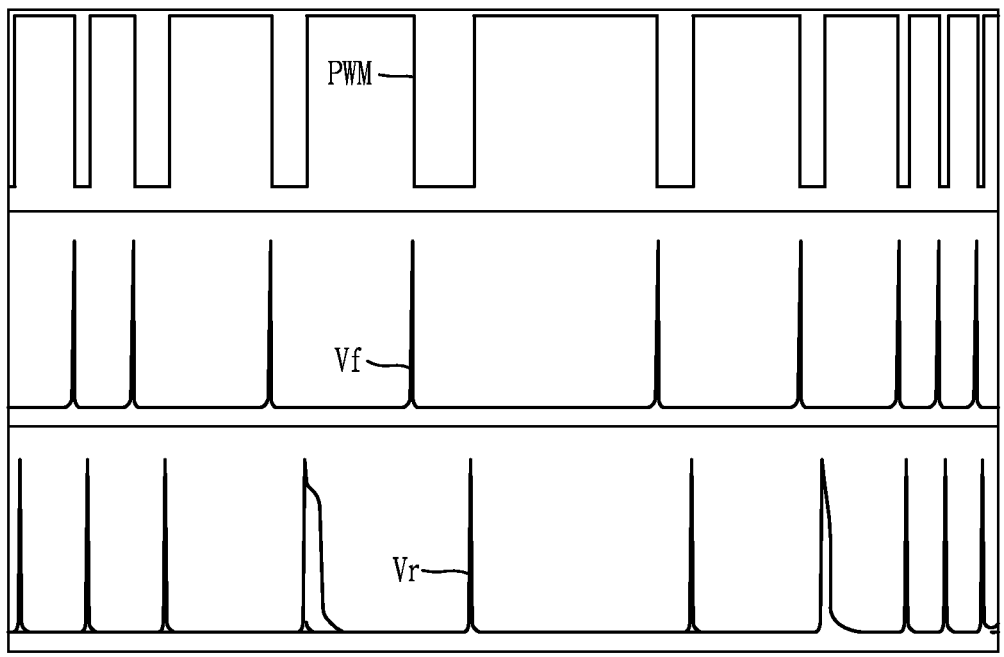
FIG. 9 is another waveform illustrating generation of a determination signal in a circuitry of an earth leakage circuit breaker according to an embodiment of the present invention.

That is, the PWM waveform of FIG. 9 may be the determination signal, an object to be determined by the earth leakage circuit breaker 50.

More specifically, the determination signal of FIG. 7 illustrates a waveform of the reference signal generated by tracking a pure earth leakage signal, and the determination signal of FIG. 9 illustrates a waveform of the determination signal, an object to be determined.

The PWM waveform of FIG. 9 has a different period and pulse width from a waveform generated by tracking the pure earth leakage signal. Whether the earth leakage signal includes noise or not may be determined by comparing a period and a pulse width of the PWM signal with those of the reference signal.

Referring to FIG. 5 back, the determination signal (PWM) generated by such processes may be transmitted to the control unit 40. Then the control unit 40 compares a period and a pulse width of the determination signal (PWM) with those of the reference signal generated by tracking a pure earth leakage signal not including noise, thereby determining whether the earth leakage signal (Vin) includes noise or not.

In a case where the determination signal (PWM) is consistent with the reference signal, the control unit 40 may control the trip coil 10 to be operated (to be magnetized). In a case where the determination signal (PWM) is not consistent with the reference signal, the control unit 40 may control the trip coil 10 not to be operated (to be demagnetized), by determining that the earth leakage signal (Vin) includes noise. This may allow the earth leakage circuit breaker 50 to be tripped or to be prevented from being tripped, without a malfunction with respect to the earth leakage signal (Vin).

The control unit 40 may determine a size of the earth leakage signal (Vin) based on a period and a pulse width of the determination signal (PWM), and may control an operation time of the trip coil 10 according to the determined size of the earth leakage signal (Vin). For instance, when it is determined that a size of the earth leakage signal (Vin) is larger than a size of the reference signal, the control unit 40 may shorten an operation time of the trip coil 10 so that the circuit can be protected more rapidly and stably.

The embodiments of the present invention may be applicable to an earth leakage circuit breaker which is operated by detecting an earth leakage signal.

The embodiments of the present invention may be applicable to an electronic relay including a mechanical type and a digital type.

The embodiments of the present invention may be applicable to an earth leakage circuit breaker including a relay, a switching device, a controller, power protective equipment, etc.

The embodiments of the present invention may be applicable to a power substation facility and a power substation system including a relay and a circuit breaker.

The embodiments of the present invention may be applicable to a customer protective relay system including a relay and a circuit breaker.

The embodiments of the present invention may be executed in a software manner by programming a method of tracking an earth leakage signal, and a method of generating a determination signal. Alternatively, the embodiments of the present invention may be executed through a combination of at least one of the embodiments.

The earth leakage circuit breaker of the present invention can have the following advantages.

Firstly, whether an earth leakage signal includes noise or not is determined based on a determination signal generated by tracking the earth leakage signal. Accordingly, the earth leakage signal applied to the earth leakage circuit breaker can be determined with high accuracy.

Secondly, whether an earth leakage signal includes noise or not is determined based on a determination signal generated by tracking the earth leakage signal. Accordingly, whether to perform a trip operation with respect to the earth leakage signal applied to the earth leakage circuit breaker can be determined without an error.

Thirdly, whether an earth leakage signal includes noise or not is determined based on a determination signal generated by tracking the earth leakage signal. Accordingly, a malfunction of the earth leakage circuit breaker due to a noise signal similar to the earth leakage signal can be prevented.

Fourthly, whether an earth leakage signal includes noise or not is determined based on a determination signal generated by tracking the earth leakage signal. Accordingly, an unnecessary trip operation of the earth leakage circuit breaker due to a noise signal can be prevented. Thus, a lifespan of the earth leakage circuit breaker can be prolonged.

Fifthly, whether an earth leakage signal includes noise or not is determined based on a determination signal generated by tracking the earth leakage signal. Accordingly, an unnecessary trip operation of the earth leakage circuit breaker due to a noise signal can be prevented. Thus, a circuit and a load can be protected efficiently and stably.

Sixthly, whether an earth leakage signal includes noise or not is determined based on a determination signal generated by tracking the earth leakage signal. Accordingly, the earth leakage circuit breaker can properly perform an interrupting operation according to the degree of current leakage.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. An earth leakage circuit breaker, comprising:
a trip coil configured to generate an electromagnetic force for tripping a circuit;
a detection unit configured to detect an earth leakage signal on the circuit;
a signal generation unit configured to generate a determination signal by tracking the earth leakage signal; and
a controller configured to determine whether the earth leakage signal includes noise or not by comparing the determination signal with a reference signal, and configured to control an operation of the trip coil according to a result of the determination,
wherein the signal generation unit comprises a charging and discharging circuit,
wherein the determination signal is generated as an output signal of the charging and discharging circuit tracks the earth leakage signal,
wherein the signal generation unit comprises:
a first voltage discriminator configured to charge the charging and discharging circuit, by comparing the earth leakage signal and the output signal with a first reference voltage;
a second voltage discriminator configured to compare the output signal with the earth leakage signal and a second reference voltage, and to generate a signal according to a result of the comparison;
a pulse generator configured to generate a determination signal by generating one of a high pulse and a low pulse, based on the signal according to a result of the comparison of the second voltage discriminator; and
a switch connected to the charging and discharging circuit, and configured to discharge the charging and discharging circuit by being opened when the high pulse is applied thereto from the pulse generator, the switch configured to charge the charging and discharging circuit by being closed when the low pulse generated is applied thereto from the pulse generator,
wherein the output signal is fed-back to the second voltage discriminator until tracking the earth leakage signal is completed.

2. The earth leakage circuit breaker of claim 1, wherein the detection unit comprises:
a zero-phase current transformer configured to detect the earth leakage signal; and
an amplifier configured to amplify the detected earth leakage signal.

3. The earth leakage circuit breaker of claim 1, wherein the determination signal is generated by tracking the earth leakage signal according to time.

4. The earth leakage circuit breaker of claim 3, wherein the determination signal is generated as a pulse width modulation signal.

5. The earth leakage circuit breaker of claim 4, wherein the determination signal is configured by a combination of a low pulse and a high pulse.

6. The earth leakage circuit breaker of claim 1, wherein the first reference voltage is a minimum reference voltage, a reference voltage value for tripping the earth leakage circuit breaker, and
wherein the second reference voltage is a minimum reference voltage, a minimum output level of the charging and discharging circuit.

7. The earth leakage circuit breaker of claim 1, wherein when the earth leakage signal is greater than the first reference voltage, the first voltage discriminator is configured to charge the charging and discharging circuit such that a size of the output signal becomes equal to a size of the earth leakage signal.

8. The earth leakage circuit breaker of claim 1, wherein when a size of the output signal becomes equal to a size of the earth leakage signal, the second voltage discriminator is configured to generate a rising signal for decreasing the output signal, and
wherein when a size of the output signal becomes equal to a size of the second reference voltage, the second voltage discriminator is configured to generate a falling signal for increasing the output signal.

9. The earth leakage circuit breaker of claim 8, wherein the pulse generator is configured to generate the high pulse when the rising signal is generated, and to generate the low pulse when the falling signal is generated.

10. The earth leakage circuit breaker of claim 1, wherein the reference signal is generated by tracking a pure earth leakage signal not including noise.

11. The earth leakage circuit breaker of claim 1, wherein the control unit is configured to compare a period and a pulse width of the determination signal, with a period and a pulse width of the reference signal.

12. The earth leakage circuit breaker of claim 1, wherein when the determination signal is consistent with the reference signal, the control unit is configured to control the trip coil to be magnetized.

13. The earth leakage circuit breaker of claim 1, wherein when the determination signal is not consistent with the reference signal, the control unit is configured to control the trip coil to be demagnetized, by determining that the earth leakage signal includes noise.

14. The earth leakage circuit breaker of claim 1, wherein the control unit is configured to determine a size of the earth leakage signal based on a period and a pulse width of the determination signal, and to control an operation time of the trip coil according to the determined size of the earth leakage signal.

15. The earth leakage circuit breaker of claim 14, wherein when the determined size of the earth leakage signal is larger than a size of the reference signal, the control unit is configured to shorten an operation time of the trip coil.

* * * * *